(12) United States Patent
Paek et al.

(10) Patent No.: US 11,539,134 B2
(45) Date of Patent: Dec. 27, 2022

(54) CAPACITOR CIRCUIT AND VARIABLE CAPACITANCE SYSTEM INCLUDING THE SAME

(71) Applicant: Samsung Electro-Mechanics Co., Ltd., Suwon-si (KR)

(72) Inventors: Hyun Paek, Suwon-si (KR); Wonsun Hwang, Suwon-si (KR); Youngsik Hur, Suwon-si (KR); Yoosam Na, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 240 days.

(21) Appl. No.: 17/102,981

(22) Filed: Nov. 24, 2020

(65) Prior Publication Data

US 2022/0045427 A1 Feb. 10, 2022

(30) Foreign Application Priority Data

Aug. 4, 2020 (KR) ........................ 10-2020-0097594

(51) Int. Cl.
| | | |
|---|---|---|
| *H01Q 5/50* | (2015.01) | |
| *H01Q 5/328* | (2015.01) | |
| *H03M 1/80* | (2006.01) | |
| *H03H 7/40* | (2006.01) | |
| *H01G 17/00* | (2006.01) | |
| *H01G 7/00* | (2006.01) | |

(52) U.S. Cl.
CPC ................. *H01Q 5/50* (2015.01); *H01G 7/00* (2013.01); *H01G 17/00* (2013.01); *H01Q 5/328* (2015.01); *H03H 7/40* (2013.01); *H03M 1/802* (2013.01); *H03H 2210/025* (2013.01)

(58) Field of Classification Search
CPC ......... H03M 1/802; H04B 1/006; H04B 1/40; H04B 1/18; H04B 1/0458
See application file for complete search history.

(56) References Cited

U.S. PATENT DOCUMENTS

| | | | | |
|---|---|---|---|---|
| 5,684,487 A | * | 11/1997 | Timko ................ | H03M 1/1047 |
| | | | | 341/172 |
| 7,705,765 B1 | * | 4/2010 | Yang .................. | H03M 1/1061 |
| | | | | 341/172 |
| 7,800,458 B2 | | 9/2010 | Shin et al. | |
| 8,188,753 B2 | * | 5/2012 | Nestler ................ | H03H 15/02 |
| | | | | 324/658 |

(Continued)

FOREIGN PATENT DOCUMENTS

KR 10-0935969 B1 1/2010

*Primary Examiner* — Lam T Mai
(74) *Attorney, Agent, or Firm* — NSIP Law

(57) ABSTRACT

A capacitor circuit includes a first capacitor bank and a second capacitor bank. The first capacitor bank includes p switch-capacitor circuits connected to each other in parallel, where p is a natural number of 2 or more, wherein at least two switch-capacitor circuits among the p switch-capacitor circuits have mutually different capacitance values based on a first weight. The second capacitor bank includes q switch-capacitor circuits connected to each other in parallel, where q is a natural number greater than p, wherein at least two of the q switch-capacitor circuits have mutually different capacitance values based on a second weight different from the first weight.

20 Claims, 8 Drawing Sheets

(56) References Cited

U.S. PATENT DOCUMENTS

| | | | |
|---|---|---|---|
| 8,416,107 B1* | 4/2013 | Wan | H03M 1/1033 |
| | | | 341/120 |
| 8,537,046 B2* | 9/2013 | Zhao | H03M 1/0604 |
| | | | 341/172 |
| 9,602,119 B1* | 3/2017 | Maulik | H03M 1/1014 |
| 9,912,343 B1* | 3/2018 | Li | H03M 1/1009 |
| 10,333,539 B2* | 6/2019 | Hsu | H03M 1/0607 |
| 10,505,558 B2* | 12/2019 | Yagishita | H03K 19/0016 |
| 2004/0137865 A1 | 7/2004 | Callias et al. | |
| 2020/0083893 A1* | 3/2020 | Konradsson | H03L 7/093 |
| 2020/0162096 A1 | 5/2020 | Guo et al. | |
| 2020/0295769 A1* | 9/2020 | Hermoso | H03C 3/0966 |

\* cited by examiner

FIG. 3

|  | 1st Capacitor | 2nd Capacitor | 3rd Capacitor | 4th Capacitor | pth Capacitor | (p+1)th Capacitor | (p+2)th Capacitor | (p+3)th Capacitor | ... | (p+(n-1))th Capacitor |
|---|---|---|---|---|---|---|---|---|---|---|
| 1st cap bank | K1*(2^0) pF | K1*(2^1) pF | K1*(2^2) pF | K1*(2^3) pF | K1*(2^(p-1)) pF | | | | | |
| 2nd cap bank | K2*(2^0) pF | K2*(2^1) pF | K2*(2^2) pF | K2*(2^3) pF | K2*(2^(p-1)) pF | K2*(2^0) pF | | | | |
| 3rd cap bank | K3*(2^0) pF | K3*(2^1) pF | K3*(2^2) pF | K3*(2^3) pF | K3*(2^(p-1)) pF | K3*(2^p) pF | K3*(2^0) pF | | | |
| 4th cap bank | K4*(2^0) pF | K4*(2^1) pF | K4*(2^2) pF | K4*(2^3) pF | K4*(2^(p-1)) pF | K3*(2^p) pF | K4*(2^(p+1)) pF | K4*(2^0) pF | | |
| ... | ... | ... | ... | ... | ... | ... | ... | ... | ... | |
| nth cap bank | Kn*(2^0) pF | Kn*(2^1) pF | Kn*(2^2) pF | Kn*(2^3) pF | Kn*(2^(p-1)) pF | Kn*(2^p) pF | Kn*(2^(p+1)) pF | Kn*(2^(p+2)) pF | ... | Kn*(2^0) pF |

FIG. 6

| | 100_2 | | | | | 100_1 | | | | Control Bits | | | | | Total Capacitance [pF] | Tuning Increment [pF] |
|---|---|---|---|---|---|---|---|---|---|---|---|---|---|---|---|---|
| | C2_5 0.5pF | C2_4 4pF | C2_3 2pF | C2_2 1pF | C2_1 0.5pF | C1_4 2pF | C1_3 1pF | C1_2 0.5pF | C1_1 0.25pF | CB4 (2^4) | CB3 (2^3) | CB2 (2^2) | CB1 (2^1) | CB0 (2^0) | | |
| 610 | OFF | OFF | OFF | OFF | OFF | OFF | OFF | OFF | OFF | 0 | 0 | 0 | 0 | 0 | 0 | 0.25 |
| | OFF | OFF | OFF | OFF | OFF | OFF | OFF | OFF | ON | 0 | 0 | 0 | 0 | 1 | 0.25 | |
| | OFF | OFF | OFF | OFF | OFF | OFF | OFF | ON | OFF | 0 | 0 | 0 | 1 | 0 | 0.5 | |
| | OFF | OFF | OFF | OFF | OFF | OFF | OFF | ON | ON | 0 | 0 | 0 | 1 | 1 | 0.75 | |
| | OFF | OFF | OFF | OFF | OFF | OFF | ON | OFF | OFF | 0 | 0 | 1 | 0 | 0 | 1 | |
| | OFF | OFF | OFF | OFF | OFF | OFF | ON | OFF | ON | 0 | 0 | 1 | 0 | 1 | 1.25 | |
| | OFF | OFF | OFF | OFF | OFF | OFF | ON | ON | OFF | 0 | 0 | 1 | 1 | 0 | 1.5 | |
| | OFF | OFF | OFF | OFF | OFF | OFF | ON | ON | ON | 0 | 0 | 1 | 1 | 1 | 1.75 | |
| | OFF | OFF | OFF | OFF | OFF | ON | OFF | OFF | OFF | 0 | 1 | 0 | 0 | 0 | 2 | |
| | OFF | OFF | OFF | OFF | OFF | ON | OFF | OFF | ON | 0 | 1 | 0 | 0 | 1 | 2.25 | |
| | OFF | OFF | OFF | OFF | OFF | ON | OFF | ON | OFF | 0 | 1 | 0 | 1 | 0 | 2.5 | |
| | OFF | OFF | OFF | OFF | OFF | ON | OFF | ON | ON | 0 | 1 | 0 | 1 | 1 | 2.75 | |
| | OFF | OFF | OFF | OFF | OFF | ON | ON | OFF | OFF | 0 | 1 | 1 | 0 | 0 | 3 | |
| | OFF | OFF | OFF | OFF | OFF | ON | ON | OFF | ON | 0 | 1 | 1 | 0 | 1 | 3.25 | |
| | OFF | OFF | OFF | OFF | OFF | ON | ON | ON | OFF | 0 | 1 | 1 | 1 | 0 | 3.5 | |
| | OFF | OFF | OFF | OFF | OFF | ON | ON | ON | ON | 0 | 1 | 1 | 1 | 1 | 3.75 | |
| 620 | ON | OFF | OFF | OFF | OFF | ON | ON | ON | ON | 1 | 0 | 0 | 0 | 0 | 4.25 | 0.5 |
| | ON | OFF | OFF | OFF | ON | ON | ON | ON | ON | 1 | 0 | 0 | 0 | 1 | 4.75 | |
| | ON | OFF | OFF | ON | OFF | ON | ON | ON | ON | 1 | 0 | 0 | 1 | 0 | 5.25 | |
| | ON | OFF | OFF | ON | ON | ON | ON | ON | ON | 1 | 0 | 0 | 1 | 1 | 5.75 | |
| | ON | OFF | ON | OFF | OFF | ON | ON | ON | ON | 1 | 0 | 1 | 0 | 0 | 6.25 | |
| | ON | OFF | ON | OFF | ON | ON | ON | ON | ON | 1 | 0 | 1 | 0 | 1 | 6.75 | |
| | ON | OFF | ON | ON | OFF | ON | ON | ON | ON | 1 | 0 | 1 | 1 | 0 | 7.25 | |
| | ON | OFF | ON | ON | ON | ON | ON | ON | ON | 1 | 0 | 1 | 1 | 1 | 7.75 | |
| | ON | ON | OFF | OFF | OFF | ON | ON | ON | ON | 1 | 1 | 0 | 0 | 0 | 8.25 | |
| | ON | ON | OFF | OFF | ON | ON | ON | ON | ON | 1 | 1 | 0 | 0 | 1 | 8.75 | |
| | ON | ON | OFF | ON | OFF | ON | ON | ON | ON | 1 | 1 | 0 | 1 | 0 | 9.25 | |
| | ON | ON | OFF | ON | ON | ON | ON | ON | ON | 1 | 1 | 0 | 1 | 1 | 9.75 | |
| | ON | ON | ON | OFF | OFF | ON | ON | ON | ON | 1 | 1 | 1 | 0 | 0 | 10.25 | |
| | ON | ON | ON | OFF | ON | ON | ON | ON | ON | 1 | 1 | 1 | 0 | 1 | 10.75 | |
| | ON | ON | ON | ON | OFF | ON | ON | ON | ON | 1 | 1 | 1 | 1 | 0 | 11.25 | |
| | ON | ON | ON | ON | ON | ON | ON | ON | ON | 1 | 1 | 1 | 1 | 1 | 11.75 | |

CAPACITOR CIRCUIT AND VARIABLE CAPACITANCE SYSTEM INCLUDING THE SAME

CROSS-REFERENCE TO RELATED APPLICATIONS

This application claims the benefit under 35 USC 119(a) of Korean Patent Application No. 10-2020-0097594 filed on Aug. 4, 2020, in the Korean Intellectual Property Office, the entire disclosures of which is incorporated herein by reference for all purposes.

BACKGROUND

1. Field

This application relates to a capacitor circuit and a variable capacitance system including the same.

2. Description of Related Art

Various frequency bands have been used in recent communication systems, and a radio-frequency (RF) device in these communication systems needs to support the various frequency bands. Accordingly, the design of a multi-band antenna has become increasingly difficult and complicated. To support a multi-band antenna, there is a need for a switch that is capable of adjusting the impedance of the multi-band antenna.

As a method for adjusting the impedance of an antenna, an array capacitor has been proposed. To provide various capacitances using an array capacitor, a binary weight value method has been used. In the binary weight value method, a plurality of capacitors arranged in an array have capacitance values that are binary weight values, and a total capacitance value may be determined by selecting a capacitor from the plurality of capacitors.

Such a binary weight value method may not be suitable for tuning the impedance of the multi-band antenna. An array capacitor to which the binary weight value method is applied can provide capacitance values having a uniform distribution, but the impedance matching frequency of the multi-band antenna does not have a uniform distribution. A resonance frequency f, a capacitance C, and an inductance L of the multi-band antenna have the relationship shown in Equation 1 below.

$$f = \frac{1}{2\pi\sqrt{LC}} \quad (1)$$

In Equation 1, when it is assumed that the inductance value is constant, the frequency distribution is not uniform due to the capacitance values having a uniform distribution. Due to the capacitance values having a uniform distribution (e.g., 0.5 pF, 1 pF, 2 pF . . . ), the frequency distribution becomes sparse as the frequency increases, and becomes dense as the frequency decreases.

As a result of this, there is a limitation in effectively tuning various frequency bands when tuning multi-band antenna using the binary weight value method.

The above information disclosed in this Background section is only for enhancement of understanding of this application, and therefore it may contain information that is known to the inventors of this application, but is not prior art.

SUMMARY OF THE INVENTION

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a capacitor circuit includes a first capacitor bank including p switch-capacitor circuits connected to each other in parallel, where p is a natural number of 2 or more, wherein at least two switch-capacitor circuits among the p switch-capacitor circuits have mutually different capacitance values based on a first weight; and a second capacitor bank including q switch-capacitor circuits connected to each other in parallel, where q is a natural number greater than p, wherein at least two switch-capacitor circuits among the q switch-capacitor circuits have mutually different capacitance values based on a second weight different from the first weight.

Each of the p switch-capacitor circuits may include a first capacitor and a first switch connected to each other in series, and the first capacitors of the p switch-capacitor circuits have mutually different capacitance values based on the first weight.

Each of the q switch-capacitor circuits may include a second capacitor and a second switch connected to each other in series, and the second capacitors of the q switch-capacitor circuits may have mutually different capacitance values based on the second weight.

Capacitance values of the first capacitors may be based on powers of 2 and the first weight, and capacitance values of the second capacitors may be based on powers of 2 and the second weight.

The p switch-capacitor circuits and the q switch-capacitor circuits may be configured to be controlled by at least q control bits.

The first capacitor bank and the second capacitor bank may be configured so that a most significant bit of the q control bits selects one of the first capacitor bank and the second capacitor bank.

The q switch-capacitor circuits may be configured to be turned on and off by control bits, and all of the p switch-capacitor circuits may be configured to be turned on in response to any one of the q switch-capacitor circuits being turned on by a first bit among the control bits.

The first bit may be a most significant bit of the control bits.

The second weight may be greater than the first weight.

The capacitor circuit may be configured to be connected to an antenna to tune an impedance of the antenna, and a tuning increment provided by the first capacitor bank may be different from a tuning increment provided by the second capacitor bank.

In another general aspect, a variable capacitance system includes a capacitor circuit configured to provide a capacitance value as part of an impedance of an antenna, the capacitor circuit including a first capacitor bank and a second capacitor bank; and a controller configured to control capacitance values provided by the first capacitor bank and the second capacitor bank, wherein the first capacitor bank includes a plurality of first capacitors having mutually different capacitance values based on a first weight, and the second capacitor bank includes a plurality of second capacitors having mutually different capacitance values based on a second weight different from the first weight.

The plurality of first capacitors may be p first capacitors, where p is a natural number of 2 or more, and the plurality of second capacitors may be q second capacitors, where q is a natural number greater than p.

The first capacitor bank may further include p first switches respectively connected to the p first capacitors, the second capacitor bank may further include q second switches respectively connected to the q second capacitors, and the controller may be further configured to turn on or turn off each of the p first switches and each of the q second switches.

The controller may be further configured to turn on or turn off each of the p first switches and each of the q second switches in response to at least q control bits.

The controller may be further configured to turn on all of the p first switches in response to the controller turning on at least one of the q second switches.

The controller may be further configured to turn on or turn off each of the p first switches and each of the q second switches in response to control bits, turn on the at least one of the q second switches in response to at least a most significant bit of the control bits, and turn on all of the p first switches in response to the most significant bit of the control bits.

In another general aspect, a capacitor circuit includes a first capacitor bank and a second capacitor bank connected to each other in parallel, wherein the first capacitor bank includes p switch-capacitor circuits connected to each other in parallel, where p is a natural number of 2 or more, the second capacitor bank includes p+1 switch-capacitor circuits connected to each other in parallel, the p switch-capacitor circuits of the first capacitor bank have mutually different capacitance values, first to p-th switch-capacitor circuits of the second capacitor bank have mutually different capacitance values, and the first switch-capacitor circuit and a p+1-th switch-capacitor circuit of the second capacitor bank have a same capacitance value.

Each of the p switch-capacitor circuits of the first capacitor bank and each of the p+1 switch-capacitor circuits of the second capacitor bank may include a switch and a capacitor connected to each other in series.

The mutually different capacitance values of the p switch-capacitor circuits of the first capacitor bank may be multiples of a first weight, and the mutually different capacitance values of the first to p-th switch-capacitor circuits of the second capacitor bank may be multiples of a second weight different from the first weight.

The p switch-capacitor circuits of the first capacitor bank and the p+1 switch-capacitor circuits of the second capacitor bank may be configured to be turned on and off by control bits, and the p switch-capacitor circuits of the first capacitor bank and the p+1-th switch-capacitor circuit of the second capacitor bank may be configured to be turned on in response to a most significant bit of the control bits having a first value.

Other features and aspects will be apparent from the following detailed description, the drawings, and the claims.

BRIEF DESCRIPTION OF DRAWINGS

FIG. 3 is a table that shows capacitance values of capacitors of the capacitor circuit of FIG. 2.

FIG. 6 is a table showing switching signals and total capacitance values according to control bits in the capacitor circuit of FIG. 5.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
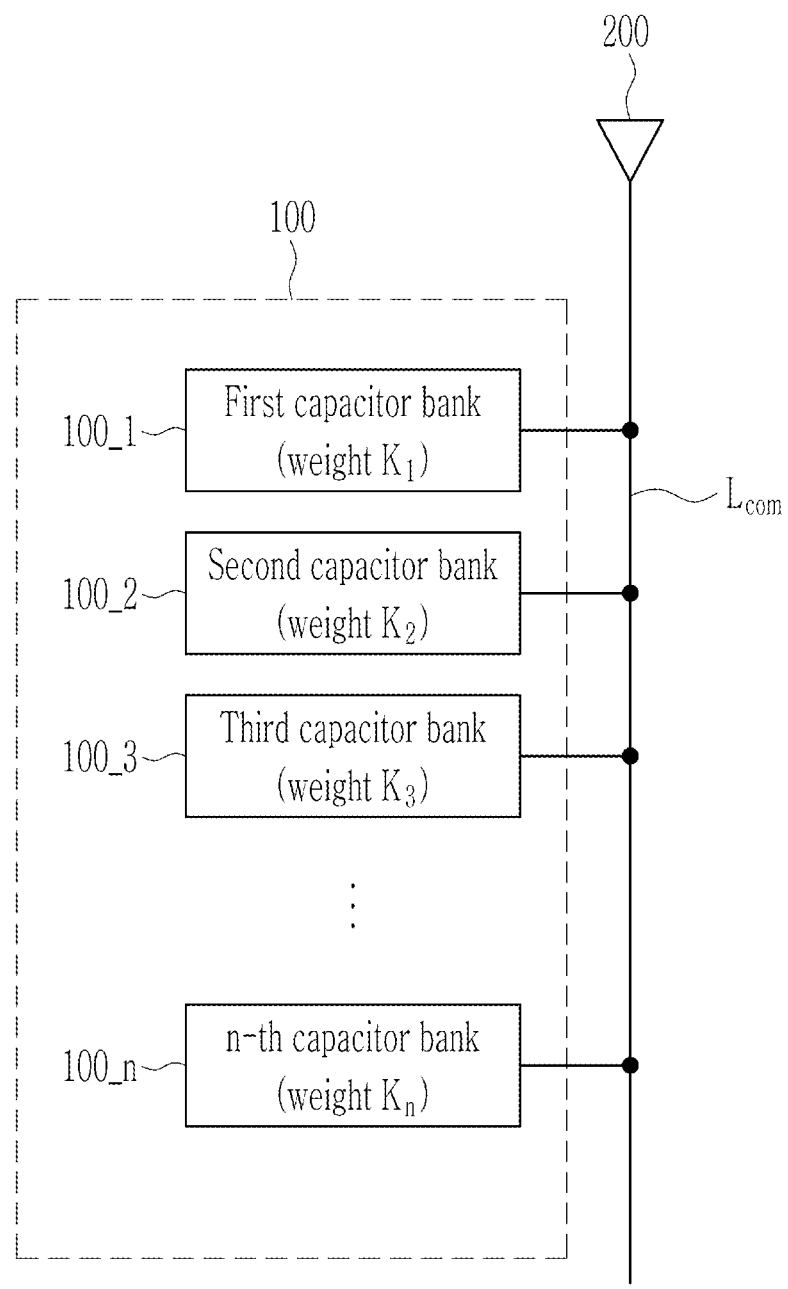
FIG. 1 shows an example of a capacitor circuit.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of functions and constructions that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Use herein of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various elements, these elements are not to be limited by these terms. Rather, these terms are only used to distinguish one element from another element. Thus, a first element referred to in examples described herein may also be referred to as a second element without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated by 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not exclude the presence or addition of one or more other features, numbers, operations, members, elements, and/or combinations thereof.

The features of the examples described herein may be combined in various ways as will be apparent after an understanding of the disclosure of this application. Furthermore, although the examples described herein have a variety of configurations, other configurations are possible as will be apparent after an understanding of the disclosure of this application.

The antenna referred to herein any transmit RF signals having a format according to Wi-Fi (IEEE 802.11 family), Worldwide Interoperability for Microwave Access (WiMAX) (IEEE 802.16 family), IEEE 802.20, Long Term Evolution (LTE), Evolution-Data Optimized (EV-DO), High Speed Packet Access (HSPA), Evolved High Speed Packet Access (HSPA+), High Speed Downlink Packet Access (HSDPA), High Speed Uplink Packet Access (HSUPA), Enhanced Data Rates for GSM Evolution (EDGE), Global System for Mobile Communications (GSM), Global Positioning System (GPS), General Packet Radio Service (GPRS), Code-Division Multiple Access (CDMA), Time-Division Multiple Access (TDMA), Digital Enhanced Cordless Telecommunications (DECT), Bluetooth, 3G, 4G, 5G, and any other wireless and wired protocols, but are not limited thereto.

FIG. 1 shows an example of a capacitor circuit.

As shown in FIG. 1, a capacitor circuit 100 includes a plurality of capacitor banks 100_1 to 100_n.

The plurality of capacitor banks may include a first capacitor bank 100_1, a second capacitor bank 100_2, a third capacitor bank 100_3, and an nth capacitor bank 100_n. The capacitor circuit 100 may include at least two capacitor banks, and therefore n may be a natural number greater than or equal to 2.

The capacitor circuit 100 is connected to an antenna 200, and provides a capacitance component for turning an impedance of the antenna 200. In order to tune the impedance of the antenna 200, a capacitance component and an inductance component are required. The capacitor circuit 100 provides the capacitance component to the antenna 200. In FIG. 1, Lcom denotes a common portion (a line) that provides the inductance component, and the capacitor circuit 100 may provide the impedance for tuning of the antenna 200 together with the inductance component provided by the Lcom. Accordingly, the capacitor circuit 100 may be connected to Lcom. That is, the plurality of capacitor banks 100_1 to 100_n may be connected to Lcom.

Each of the plurality of capacitor banks 100_1 to 100_n includes a plurality of switch-capacitor circuits connected to each other in parallel. In addition, the plurality of capacitor banks 100_1 to 100_n may respectively have predetermined weights K1 to Kn. Each of the weights K1 to Kn indicates a reference capacitance value of a capacitance value provided by each switch-capacitor circuit. That is, a first capacitor bank 100_1 may have a weight K1, a second capacitor bank 100_2 may have a weight K2, a third capacitor bank 100_3 may have a weight K3, and an n-th capacitor bank 100_n may have a weight Kn. At least two weights among the weights K1 to Kn may have different values. In addition, the plurality of capacitor banks 100_1 to 100n may respectively include a predetermined number of switch-capacitor circuits. At least two capacitor banks among the plurality of capacitor banks 100_1 to 100_n may include different numbers of switch-capacitor circuits. A detailed configuration of the switch-capacitor circuit will be described in detail with reference to FIG. 2.

Figure 2:
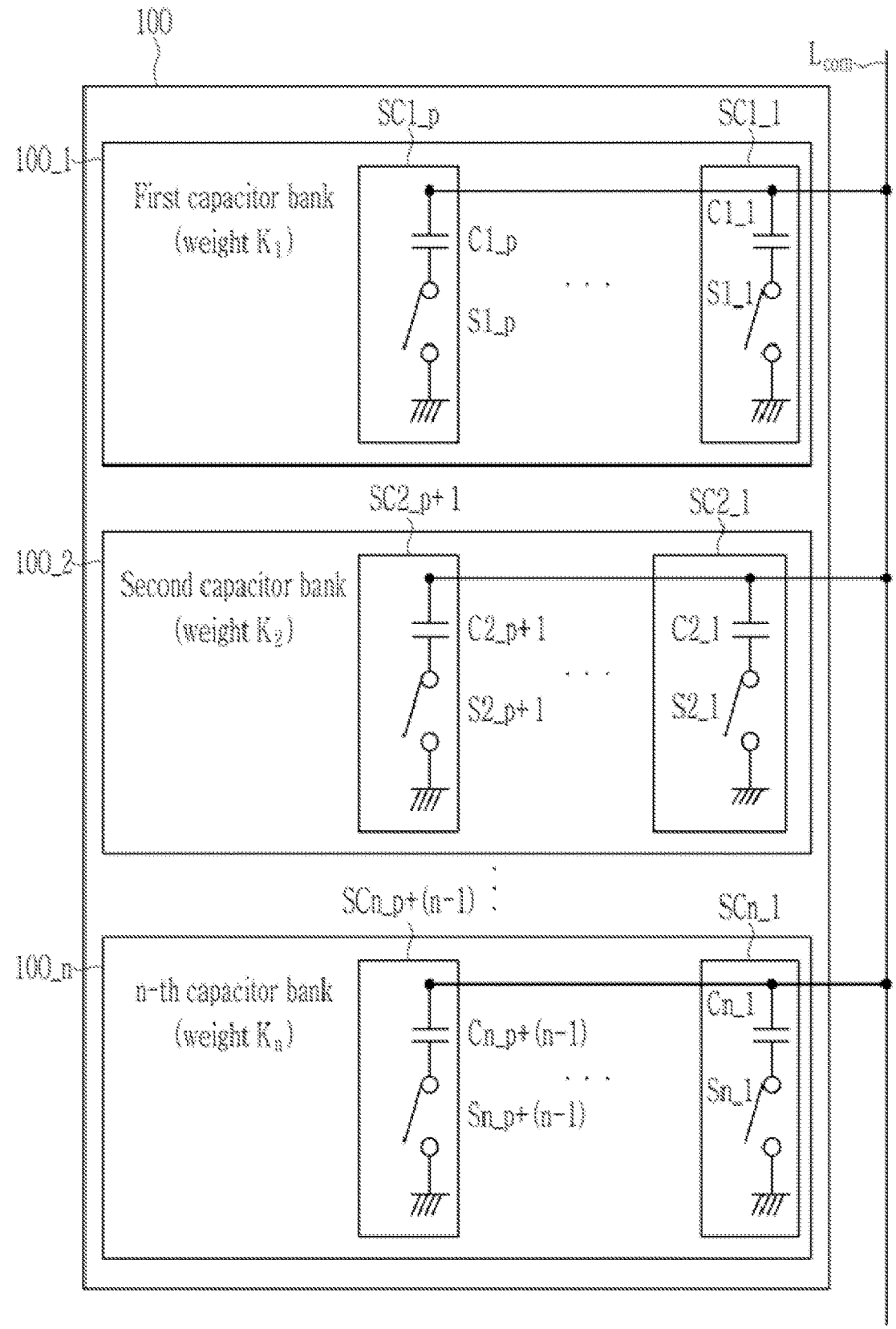
FIG. 2 shows an example of an internal configuration of the capacitor circuit of FIG. 4.

FIG. 2 shows an example of an internal configuration of the capacitor circuit of FIG. 1, and FIG. 3 is a table that shows capacitance values of capacitors of the capacitor circuit of FIG. 2.

As shown in FIG. 2, a first capacitor bank 100_1 includes a plurality of switch-capacitor circuits SC1_1 to SC1_p. That is, the first capacitor bank 100_1 includes p switch-capacitor circuits, and p may be a natural number greater than or equal to 2. The plurality of switch-capacitor circuits SC1_1 to SC1_p are connected to each other in parallel. In addition, each of the plurality of switch-capacitor circuits SC1_1 to SC1_p includes a capacitor and a switch connected to each other in series. That is, the switch-capacitor circuit SC1_1 includes a capacitor C1_1 and a switch S1_1 connected to each other in series, and the switch-capacitor circuit SC1_p includes a capacitor C1_p and a switch S1_p connected to each other in series. A capacitance value provided by the first capacitor bank 100_1 can be determined by turning on or turning off each of the switches S1_1 to S1_p. Although the example in FIG. 2 shows that the switches are connected to ground and the capacitors are connected to Lcom, the positions of the switches and the capacitors may be interchanged.

The first capacitor bank 100_1 may have a weight K1. Each capacitor included in the first capacitor bank 100_1 has a capacitance value determined by the weight K1. That is, a capacitance value of each capacitor included in the first capacitor bank 100_1 is determined based on the weight K1. Reference numeral 310 in FIG. 3 denotes capacitance values of capacitors C1_1 to C1_p of the first capacitor bank 100_1. Referring to 310 of FIG. 3, the capacitance value of each of the capacitors C1_1 to C1_p may increase by an exponential power of 2 with respect to the weight K1. That is, the capacitor C1_1 may have a capacitance value of $K1*2^0$ pF, the capacitor C1_2 may have a capacitance value of $K1*2^1$ pF, and the capacitor C_p may have a capacitance value of $K1*(2^{(p-1)})$ pF. Alternatively, the capacitance value of each of the capacitors C1_1 to C1_p may increase not by an exponential power of 2, but by an exponential power of 3, an exponential power of 4, or so on with respect to the weight K1.

As shown in FIG. 2, the second capacitor bank 100_2 includes a plurality of switch-capacitor circuits SC2_1 to SC2_$p$+1. That is, the second capacitor bank 100_2 includes $p$+1 switch-capacitor circuits, and $p$ may be a natural number greater than or equal to 2. The second capacitor bank 100_2 may include at least one more switch-capacitor circuit than the first capacitor bank 100_1. The plurality of switch-capacitor circuits SC2_1 to SC2_$p$+1 are connected to each other in parallel. In addition, each of the plurality of switch-capacitor circuits SC2_1 to SC2_$p$+1 includes a capacitor and a switch connected to each other in series. That is, the switch-capacitor circuit SC2_1 includes a capacitor C2_1 and a switch S2_1 connected to each other in series, and the switch-capacitor circuit SC2_$p$+1 includes a capacitor C2_$p$+1 and a switch S2_$p$+1 connected to each other in series. A turn-on state or a turn-off state of each of the switches S2_1 to S2_$p$+1 determines a capacitance value provided by the second capacitor bank 100_2.

The second capacitor bank 100_2 may have a weight K2. Each capacitor included in the second capacitor bank 100_2 has a capacitance value determined by the weight K2. That is, each capacitor included in the second capacitor bank 100_2 has a capacitance value determined based on the weight K2. Reference numeral 320 in FIG. 3 denotes capacitance values of the respective capacitors C2_1-C2_$p$+1 of the second capacitor bank 100_2. Referring to 320 of FIG. 3, the capacitance value of each of the capacitors C2_1 to C2_$p$+1 may increase by an exponential power of 2 with respect to the weight K2. That is, the capacitor C2_1 may have a capacitance value of K2*2^1 pF, the capacitor C2_2 may have a capacitance value of K2*2^0 pF, and the capacitor C2_$p$ may have a capacitance value of K2*(2^($p$-1)) pF. However, the last capacitance C2_$p$+1 in the second capacitor bank 100_2 may have a capacitance value of K2*2^0 pF, which is the same as that of the first capacitor C2_1. This enables efficient utilization of control bits that control the switches, and this will be described in detail later with reference to FIG. 6. Alternatively, a capacitance value of each of the capacitors C2_1 to C2_$p$+1 may increase not by an exponential power of 2, but by an exponential power of 3, an exponential power of 4, or so on with respect to the weight K2.

As shown in FIG. 2, the n-th capacitor bank 100_$n$ includes a plurality of switch-capacitor circuits SCn_1 to SCn_p+(n−1). That is, the n-th capacitor bank 100_$n$ may include p+(n−1) switch-capacitor circuits. The n-th capacitor bank 100_$n$ may include at least (n−1) more switch-capacitor circuits than the first capacitor bank 100_1. The plurality of switch-capacitor circuits SCn_1 to SCn_p+(n−1) are connected to each other in parallel. In addition, each of the plurality of switch-capacitor circuits SCn_1 to SCn_p+(n−1) includes a capacitor and a switch connected to each other in series. That is, the switch-capacitor circuit SCn_1 includes a capacitor Cn_1 and a switch Sn_1 connected to each other in series, and the switch-capacitor circuit SCn_p+(n−1) includes a capacitor Cn_p+(n−1) and a switch Sn_p+(n−1) connected to each other in series. Capacitance values provided by the n-th capacitor bank 100_$n$ are determined by the turn-on state and the turn-off state of each of the switches Sn_1 to Sn_p+(n−1).

The n-th capacitor bank 100_$n$ may have a weight Kn. Each capacitor included in the n-th capacitor bank 100_$n$ has a capacitance value determined by the weight Kn. That is, a capacitance value of each capacitor included in the n-th capacitor bank 100_$n$ is determined based on the weight Kn. Reference numeral 330 in FIG. 3 denotes capacitance values of the respective capacitors Cn_1-Cn_p+(n−1) of the n-th capacitor bank 100_$n$. Referring to 330 of FIG. 3, the capacitance value of each of the capacitors Cn_1 to Cn_p+(n−1) may increase by an exponential power of 2 with respect to the weight Kn.

That is, the capacitor Cn_1 may have a capacitance value of Kn*2^0 pF, the capacitor Cn_2 may have a capacitance value of Kn*2^1 pF, and the capacitor Cn_p may have a capacitance value of K2*(2^($p$-1)) pF. Meanwhile, in the n-th capacitor bank 100_$n$, the last capacitor Cn_p+(n−1) may have a capacitance value of Kn*2^0 pF, which is the same capacitance value as the first capacitor Cn_1. This enables to make the most of the control bit that controls each switch, and this will be described in detail later with reference to FIG. 6. Alternatively, a capacitance value of each of the capacitors Cn_1 to C2_$p$+(n−1) may increase not by an exponential power of 2, but by an exponential power of 3, an exponential power of 4, or so on with respect to the weight Kn.

At least two weights of the above-stated plurality of weights K1 to Kn may have different values. The plurality of weights K1 to Kn may have values of a positive real number. For example, the plurality of weights K1 to Kn may be binary weights. That is, the binary weights may be K2=2*K1, K3=3*K1, . . . , and Kn=n*K1. Alternatively, the plurality of weights K1 to Kn may be various weights such as a double weight and a triple weight. When the plurality of weights K1-Kn have different values, each of the plurality of capacitor banks 100_1 to 100$n$ may provide capacitance values having different tuning increments.

Figure 4:
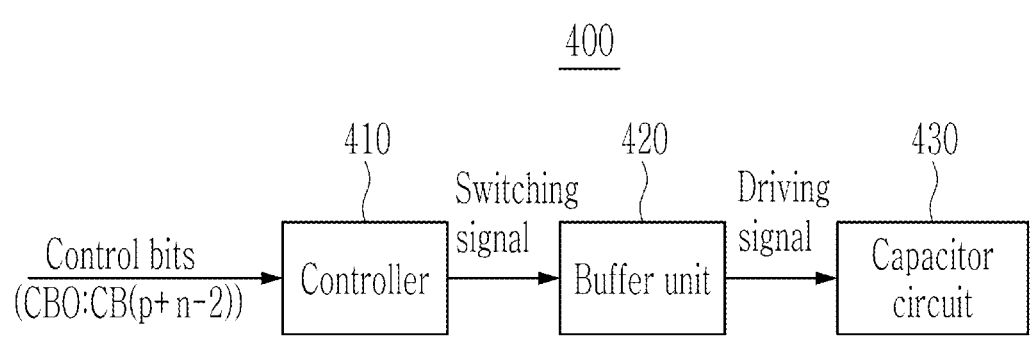
FIG. 4 is a block diagram of an example of a variable capacitance system.

FIG. 4 is a block diagram of an example of a variable capacitance system.

As shown in FIG. 4, a variable capacitance system 400 may include a controller 410, a buffer unit 420, and a capacitor circuit 430.

The controller 410 receives control bits, and outputs switching signals corresponding to the control bits. The number of control bits may be determined by a capacitor bank that has the largest number of switch-capacitor circuits among a plurality of capacitor banks 100_1 to 100_$n$. For example, when an n-th capacitor bank 100_$n$ includes p+(n−1) switch-capacitor circuits, the number of control bits may be p+(n−1). That is, the control bit may be CB0:CB(p+n−2). A switching signal is a signal that turns on or turns off a switch included in each switch-capacitor circuit. The number of switching signals may correspond to a total number of switches. The most significant bit or bits (MSB) of the control bits may serve as a selection signal that selects one of the plurality of capacitor banks 100_1 to 100_$n$.

The buffer unit 420 receives switching signals from the controller 400, and converts the switching signals to driving signals that can drive switches. When the switching signals are digital signals, the switching signals cannot directly drive switches. Accordingly, the buffer unit 420 converts the switching signals into signals that are capable of driving switches. The buffer unit 420 may include a plurality of buffers, and the plurality of buffers may correspond to a plurality of switches on a one-to-one basis. That is, the number of the plurality of buffers may correspond to the total number of switches of the capacitor circuit 100.

The capacitor circuit 430 may be the capacitor circuit 100 described above. The capacitor circuit 430 may include a plurality of capacitor banks, and each of the plurality of capacitor banks may include a plurality of switch-capacitor circuits. A switch included in the switch-capacitor circuit may be turned on or turned off by a driving signal output from the buffer unit 420.

Hereinafter, an operation method of the capacitor circuit 100 will be described with reference to FIG. 5 to FIG. 7. For better understanding and ease of description, an example in which the capacitor circuit 100 includes first and second capacitor banks 100_1 and 1002, the first capacitor bank 100_1 includes four switch-capacitor circuits, and the second capacitor bank 100_2 includes five switch-capacitor circuits, will be described. However, the following explanation is also applicable even when the capacitor circuit 100 includes three or more capacitor banks.

Figure 5:
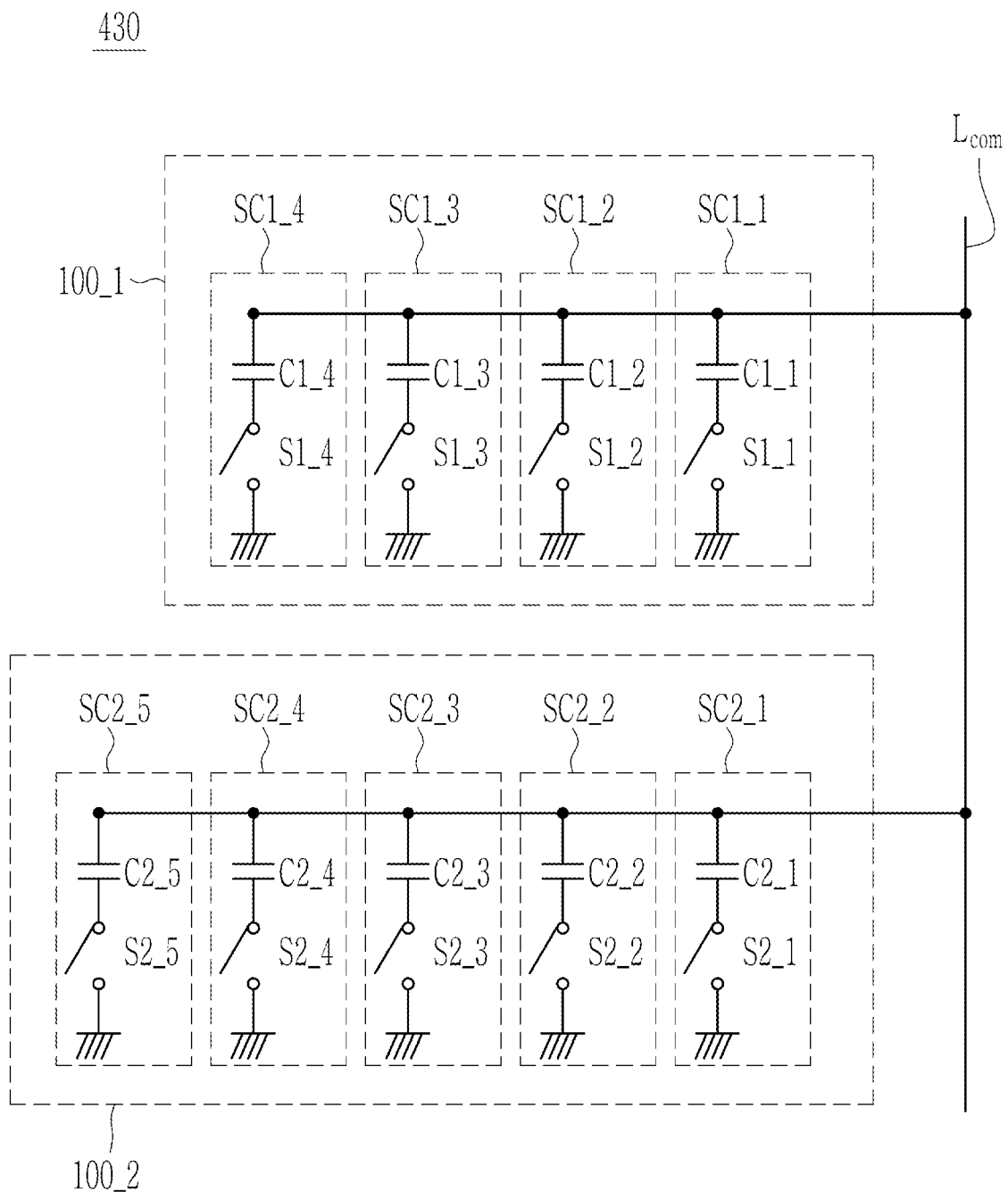
FIG. 5 is a circuit diagram of a detailed example of a capacitor circuit of the variable capacitance system of FIG. 4.

FIG. 5 is a circuit diagram of a detailed example of a capacitor circuit of the variable capacitance system of FIG. 4.

As shown in FIG. 5, a capacitor circuit 430 includes a first capacitor bank 100_1 and a second capacitor bank 100_2.

The first capacitor bank 100_1 may include four switch-capacitor circuits SC1_1 to SC1_4. The four switch-capacitor circuits SC1_1 to SC1_4 are connected to each other in parallel. In addition, each of the four switch-capacitor circuits SC1_1 to SC1_4 includes a capacitor and a switch connected to each other in series. A switch-capacitor circuit SC1_1 includes a capacitor C1_1 and a switch S1_1 connected to each other in series, and a switch-capacitor circuit SC1_2 includes a capacitor C1_2 and a switch S1_2 connected to each other in series. A switch-capacitor circuit SC1_3 includes a capacitor C1_3 and a switch S1_3 connected to each other in series, and a switch-capacitor circuit SC1_4 includes a capacitor C1_4 and a switch S1_4 connected to each other in series. In addition, the four capacitors C1_1 to C1_4 have capacitance values determined by a weight K1.

The second capacitor bank 100_2 may include five switch-capacitor circuits SC2_1 to SC2_5. The five switch-capacitor circuits SC2_1 to SC2_5 are connected to each other in parallel. In addition, each of the five switch-capacitor circuits SC2_1 to SC2_5 includes a capacitor and a switch connected to each other in series. A switch-capacitor circuit SC2_1 includes a capacitor C2_1 and a switch S2_1 connected to each other in series, and a switch-capacitor circuit SC2_2 includes a capacitor C2_2 and a switch S2_2 connected to each other in series. A switch-capacitor circuit SC2_3 includes a capacitor C2_3 and a switch S2_3 connected to each other in series, and a switch-capacitor circuit SC2_4 includes a capacitor C2_4 and a switch S2_4 connected to each other in series. A switch-capacitor circuit SC_5 includes a capacitor C2_5 and a switch S2_5 connected to each other in series. In addition, the five capacitors C2_1 to C2_5 have capacitance values determined by a weight K2.

FIG. 6 is a table showing switching signals and total capacitance values according to control bits in the capacitor circuit of FIG. 5.

In FIG. 6, it is assumed that the weight K1 of the first capacitor bank 100_1 is 0.25 and the weight K2 of the second capacitor bank 100_2 is 0.5. In addition, it is assumed that capacitance values of the capacitors C1_1 to C1_4 increase by an exponential power of 2, and capacitance values of the capacitors C2_1 to C2_4 also increase by an exponential power of 2. Accordingly, referring to FIG. 6, C1_1=0.25 pF, C1_2=0.5 pF, C1_3=1 pF, and C1_4=2 pF, and C2_1=0.5 pF, C2_2=1 pF, C2_3=2 pF, and C2_4=4 pF. In addition, it is assumed that the last capacitor C2_5 in the second capacitor bank 100_2 has the same capacitance value as the first capacitor C2_1. That is, C2_5=0.5*2=0.5 pF. In FIG. 6, the number of control bits is assumed to be five (CB0:CB4). In FIG. 6, ON and OFF denote whether each switch is turned on or turned off.

FIG. 6 can be largely divided into a first section 610 and a second section 620 according to the state of the most significant control bit CB4. In the first section 610 where the most significant control bit CB4 is 0, the control bits CB0:CB4 are used as switching signals that control switches of the first capacitor bank 100_1. In addition, in the second section 620 where the most significant control bit CB4 is 1, the control bits CB0:CB4 are used as switching signals that control switches of the second capacitor bank 100_2. That is, the most significant control bit CB4 may be used as a selection signal for selecting either one of the first and second capacitor banks 100_1 and 100_2.

First, operations in the first section 610 where the most significant control bit CB4 is 0 will be described. Since the most significant control bit CB4 is 0, the control bits CB0:CB4 are used as switching signals that control the switches S1_1 to S1_4 of the first capacitor bank 100_1.

When the control bits CB0:CB4 are 00000, all of the switches S1_1 to S1_4 are turned off, and accordingly, a total capacitance value provided by the capacitor circuit 100 is zero.

When the control bits CB0:CB4 are 00001, the switch S1_1 is turned on and the switches S1_2 to S1_4 are turned off, and accordingly, a total capacitance value provided by the capacitor circuit 100 is 0.25 pF.

In addition, when the control bits CB0:CB4 are 00010, the switch S1_2 is turned on and the switches S_1, S1_3, and S1_4 are turned off, and a total capacitance value provided by the capacitor circuit 100 is 0.5 pF.

When the control bits CB0:CB4 are 01111, the switches S1_1 to S1_4 are all turned on, and accordingly, a total capacitance value provided by the capacitor circuit 100 is 3.75 pF.

Next, operations in the second section 620 where the most significant control bit CB4 is 1 will be described. Since the most significant control bit CB4 is 1, the control bits CB0:CB4 are used as switching signals that control the switches S2_1 to S2_4 of the second capacitor bank 100_2. When the most significant control bit CB4 is 1, all of the switches S1_1 to S1_4 of the first capacitor bank 100_1 are turned on. A method for turning on all of the switches S1_1 to S1_4 when the most significant control bit CB4 is 1 will be described in detail with reference to FIG. 7.

When the control bits CB0:CB4 are 10000, the switch S2_5 is turned on and the switches S2_1 to S2_4 are all turned off. In addition, since the control bit CB4($2^4$), which is the most significant bit, is 1, all of the switches S1_1 to S4_1 of the first capacitor bank 100_1 are turned on. Accordingly, a total capacitance value provided by the capacitor circuit 100 becomes 0.5 pF+3.75 pF=4.25 pF.

When the control bits CB0:CB4 are 10001, the switches S2_5 and S2_1 are turned on and the switches S2_2 to S2_4 are turned off. In addition, since the control bit CB4($2^4$), which is the most significant bit, is 1, all of the switches S1_1 to S4_1 of the first capacitor bank 100_1 are turned on. Accordingly, a total capacitance value provided by the capacitor circuit 100 becomes 0.5 pF+0.5 pF+3.75 pF=4.75 pF.

When the control bits CB0:CB4 are 10010, the switches S2_5 and S2_2 are turned on and the switches S2_1, S2_3, and S2_4 are turned off. In addition, since the control bit CB4($2^4$), which is the most significant bit, is 1, all of the switches S1_1 to S4_1 of the first capacitor bank 100_1 are turned on. Accordingly, a total capacitance value provided by the capacitor circuit 100 becomes 0.5 pF+1 pF+3.75 pF=5.25 pF.

In addition, when the control bits CB0:CB4 are 11111, all of the switches S2_1 to S2_5 are turned on. In addition, since the control bit CB4($2^4$), which is the most significant bit, is 1, all of the switches S1_1 to S4_1 of the first capacitor bank 100_1 are turned on. Accordingly, a total capacitance value provided by the capacitor circuit 100 becomes 11.75 pF.

A tuning increment of the capacitance values provided by the capacitor circuit 100 is 0.25 pF in the first section 610. That is, in the first section 610, as the value of the control bits increases, the capacitance value increases by 0.25 pF. The tuning increment (i.e., 0.25 pF) of the first section 610 corresponds to the weight (i.e., K1=0.25) of the first capacitor bank 100_1.

A tuning increment of the capacitance values provided by the capacitor circuit 100 is 0.5 pF in the second section 620. That is, in the second section 620, as the value of the control bits increases, the capacitance value increases by 0.5 pF. The tuning increment (i.e., 0.5 pF) of the second section 620 corresponds to the weight (i.e., K2=0.5) of the second capacitor bank 100_2.

Referring to FIG. 6, all of the control bits CB0:CB4 are used to set the capacitance value of the capacitor circuit 100. In addition, even at a point where the operation of the capacitor circuit 100 changes from the first section 610 to the second section 620, the capacitor circuit 100 may provide a smoothly increasing capacitance value. That is, when the control bits CB0:CB4 are 01111, the total capacitance value is 3.75 pF, and when the control bits CB0:CB4 are 10000, the total capacitance is 4.25 pF. This is because the number of switch-capacitor circuits of the second capacitor bank 100_2 is at least one more than the number of switch-capacitor circuits of the first capacitor bank 100_1. That is, the second capacitor bank 100_2 further includes the switch-capacitor circuit SC_5. In FIG. 6, although it is shown that the capacitance value of the capacitor C2_5 is the same as that of the capacitor C2_1, the capacitance value of the capacitor C2_5 may be set to a different value.

As described above, in the second section 620, all of the switches S1_1 to S1_4 of the first capacitor bank 100_1 are turned on. That is, when the most significant control bit CB4 is 1, all of the switches S1_1 to S1_4 of the first capacitor bank 100_1 are turned on. Control logic that enables such an operation will be described with reference to FIG. 7.

Figure 7:
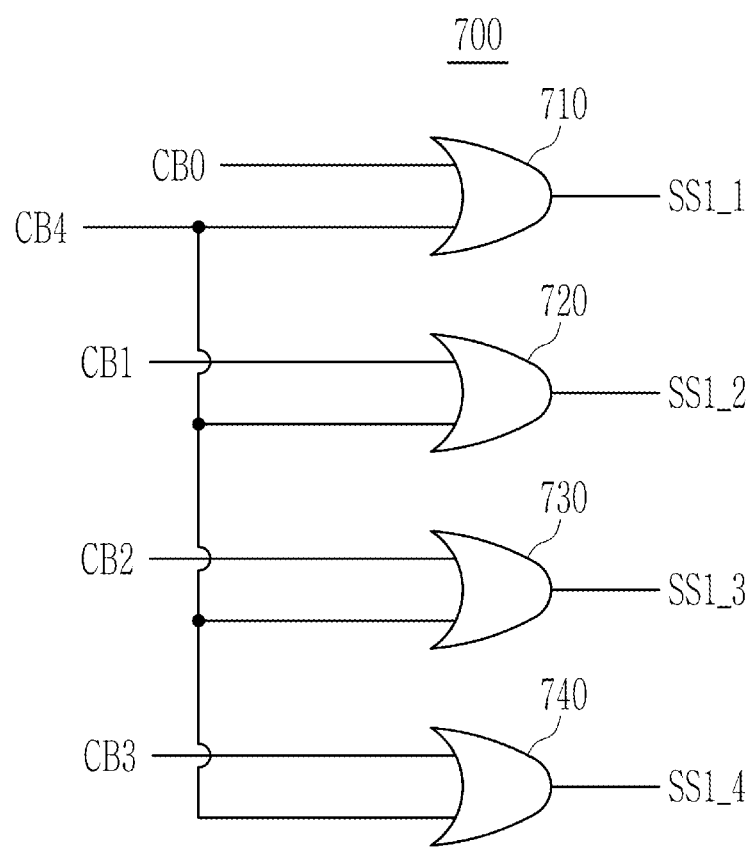
FIG. 7 shows an example of control logic of a controller of the variable capacitance system of FIG. 4.

FIG. 7 shows an example of control logic of a controller of the variable capacitance system of FIG. 4.

As shown in FIG. 7, control logic 700 includes first to fourth OR gates 710 to 740. The control logic 700 may be included in the controller 410 of the variable capacitance system of FIG. 4.

The first OR gate 710 receives a control bit CB0 and a control bit CB4, and generates an output signal SS1_1 corresponding to these two control bits. The output signal SS1_1 is a switching signal that controls the switch S1_1 of the first capacitor bank 100_1.

The second OR gate 720 receives a control bit CB1 and the control bit CB4, and generates an output signal SS1_2 corresponding to these two control bits. The output signal SS1_2 is a switching signal that controls the switch S1_2 of the first capacitor bank 100_1.

The third OR gate 730 receives a control bit CB2 and the control bit CB4, and generates an output signal SS1_3 corresponding to these two control bits. The output signal SS1_3 is a switching signal that controls the switch S1_3 of the first capacitor bank 100_1.

The third OR gate 740 receives a control bit CB3 and the control bit CB4, and generates an output signal SS1_4 corresponding to these two control bits. The output signal SS1_4 is a switching signal that controls the switch S1_4 of the first capacitor bank 100_1.

As described, the first to fourth OR gates 710 to 740 all receive the most significant bit CB4 of the control bits. Accordingly, when the most significant bit CB4 is 1, the switching signals SS1_1 to SS1_4 all become the turn-on state. That is, in the second section 620, all of the switches S1_1 to S1_4 of the first capacitor bank 100_1 are turned on.

Figure 8:
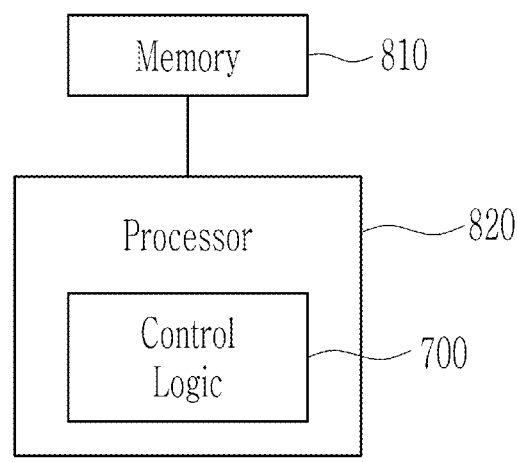
FIG. 8 is a block diagram of an example of the controller of FIG. 4 and the control logic of FIG. 7.

FIG. 8 is a block diagram of an example of the controller of FIG. 4 and the control logic of FIG. 7.

As shown in FIG. 8, the controller 410 of FIG. 4 includes a memory 810 and a processor 820. The memory 810 stores instructions that, when executed by the processor 820, cause the processor 820 to perform the functions of the controller 410 of FIG. 4 and the control logic 700 of FIG. 7. Thus, as shown in FIG. 8, the processor 820 includes the control logic 700 of FIG. 7.

In the examples described above, each of the controller 410 and the control logic 700 of the variable capacitance system 400 may be implemented in a computing environment including a processor (for example, any one or any combination of any two or more of a central processing unit (CPU), a graphics processing unit (GPU), a microprocessor, an application-specific integrated circuit (ASIC), or a field-programmable gate array (FPGA), a memory (for example, either one or both of a volatile memory (for example, a random-access memory (RAM) and a non-volatile memory (for example, either one or both of a read-only memory (ROM) and a flash memory), an input device (for example, any one or any combination of any two or more of a keyboard, a mouse, a pen, a voice input device, a touch input device, an infrared ray camera, and a video input device), an output device (for example, any one or any combination of any two or more of a display, a speaker, and a printer), and a communication interface unit (for example, any one or any combination of any two or more of a modem, a network interface card (NIC), an integrated network interface, a wireless transmitter/receiver, an infrared port, and a universal serial bus (USB) interface unit) are connected to each other (for example, via any one or any combination of any two or more of a peripheral component interface (PCI), a USB connection, a FireWire (IEEE 1394) connection, an optical bus, and a network).

The computing environment may be a personal computer, a server computer, a handheld device, a laptop device, a mobile device (for example, a mobile phone, a personal digital assistant (PDA), or a media player), a multiprocessor system, a consumer electronic device, a minicomputer, or a main frame computer, but is not limited thereto, or may be a distributed computing environment.

The controller 410 in FIG. 4 and the control logic 700 in FIG. 7 that perform the operations described in this application are implemented by hardware components configured to perform the operations described in this application that are performed by the hardware components. Alternatively, the control logic 700 may be implemented by dedicated hardware components. Examples of hardware components that may be used to perform the operations described in this application where appropriate include controllers, sensors, generators, drivers, memories, comparators, arithmetic logic units, adders, subtractors, multipliers, dividers, integrators, NOT gates, AND gates, OR gates, exclusive OR gates, transistors, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The method described with respect to FIG. 5 to FIG. 7 that performs the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A capacitor circuit comprising:
   a first capacitor bank comprising p switch-capacitor circuits connected to each other in parallel, where p is a natural number of 2 or more, wherein at least two switch-capacitor circuits among the p switch-capacitor circuits have mutually different capacitance values based on a first weight; and a second capacitor bank comprising q switch-capacitor circuits connected to each other in parallel, where q is a natural number greater than p, wherein at least two switch-capacitor circuits among the q switch-capacitor circuits have mutually different capacitance values based on a second weight different from the first weight.

2. The capacitor circuit of claim 1, wherein each of the p switch-capacitor circuits comprises a first capacitor and a first switch connected to each other in series, and the first capacitors of the p switch-capacitor circuits have mutually different capacitance values based on the first weight.

3. The capacitor circuit of claim 2, wherein each of the q switch-capacitor circuits comprises a second capacitor and a second switch connected to each other in series, and the second capacitors of the q switch-capacitor circuits have mutually different capacitance values based on the second weight.

4. The capacitor circuit of claim 3, wherein capacitance values of the first capacitors are based on powers of 2 and the first weight, and capacitance values of the second capacitors are based on powers of 2 and the second weight.

5. The capacitor circuit of claim 1, wherein the p switch-capacitor circuits and the q switch-capacitor circuits are configured to be controlled by at least q control bits.

6. The capacitor circuit of claim 5, wherein the first capacitor bank and the second capacitor bank are configured so that a most significant bit of the q control bits selects one of the first capacitor bank and the second capacitor bank.

7. The capacitor circuit of claim 1, wherein the q switch-capacitor circuits are configured to be turned on and off by control bits, and
all of the p switch-capacitor circuits are configured to be turned on in response to any one of the q switch-capacitor circuits being turned on by a first bit among the control bits.

8. The capacitor circuit of claim 7, wherein the first bit is a most significant bit of the control bits.

9. The capacitor circuit of claim 1, wherein the second weight is greater than the first weight.

10. The capacitor circuit of claim 1, wherein the capacitor circuit is configured to be connected to an antenna to tune an impedance of the antenna, and
a tuning increment provided by the first capacitor bank is different from a tuning increment provided by the second capacitor bank.

11. A variable capacitance system comprising:
a capacitor circuit configured to provide a capacitance value as part of an impedance of an antenna, the capacitor circuit comprising a first capacitor bank and a second capacitor bank; and
a controller configured to control capacitance values provided by the first capacitor bank and the second capacitor bank,
wherein the first capacitor bank comprises a plurality of first capacitors having mutually different capacitance values based on a first weight, and
the second capacitor bank comprises a plurality of second capacitors having mutually different capacitance values based on a second weight different from the first weight.

12. The variable capacitance system of claim 11, wherein the plurality of first capacitors are p first capacitors, where p is a natural number of 2 or more, and the plurality of second capacitors are q second capacitors, where q is a natural number greater than p.

13. The variable capacitance system of claim 12, wherein the first capacitor bank further comprises p first switches respectively connected to the p first capacitors,
the second capacitor bank further comprises q second switches respectively connected to the q second capacitors, and
the controller is further configured to turn on or turn off each of the p first switches and each of the q second switches.

14. The variable capacitance system of claim 13, wherein the controller is further configured to turn on or turn off each of the p first switches and each of the q second switches in response to at least q control bits.

15. The variable capacitance system of claim 13, wherein the controller is further configured to turn on all of the p first switches in response to the controller turning on at least one of the q second switches.

16. The variable capacitance system of claim 15, wherein the controller is further configured to:
turn on or turn off each of the p first switches and each of the q second switches in response to control bits,
turn on the at least one of the q second switches in response to at least a most significant bit of the control bits, and
turn on all of the p first switches in response to the most significant bit of the control bits.

17. A capacitor circuit comprising:
a first capacitor bank and a second capacitor bank connected to each other in parallel,
wherein the first capacitor bank comprises p switch-capacitor circuits connected to each other in parallel, where p is a natural number of 2 or more,
the second capacitor bank comprises p+1 switch-capacitor circuits connected to each other in parallel,
the p switch-capacitor circuits of the first capacitor bank have mutually different capacitance values,
first to p-th switch-capacitor circuits of the second capacitor bank have mutually different capacitance values, and
the first switch-capacitor circuit and a p+1-th switch-capacitor circuit of the second capacitor bank have a same capacitance value.

18. The capacitor circuit of claim 17, wherein each of the p switch-capacitor circuits of the first capacitor bank and each of the p+1 switch-capacitor circuits of the second capacitor bank comprises a switch and a capacitor connected to each other in series.

19. The capacitor circuit of claim 17, wherein the mutually different capacitance values of the p switch-capacitor circuits of the first capacitor bank are multiples of a first weight, and
the mutually different capacitance values of the first to p-th switch-capacitor circuits of the second capacitor bank are multiples of a second weight different from the first weight.

20. The capacitor circuit of claim 17, wherein the p switch-capacitor circuits of the first capacitor bank and the p+1 switch-capacitor circuits of the second capacitor bank are configured to be turned on and off by control bits, and
the p switch-capacitor circuits of the first capacitor bank and the p+1-th switch-capacitor circuit of the second capacitor bank are configured to be turned on in response to a most significant bit of the control bits having a first value.

* * * * *